United States Patent
Mukae et al.

(10) Patent No.: US 7,973,247 B2
(45) Date of Patent: Jul. 5, 2011

(54) CONNECTING PORTION OF CIRCUIT BOARD AND CIRCUIT BOARD-CONNECTING STRUCTURE TECHNICAL FIELD

(75) Inventors: Hidetsugu Mukae, Kanagawa (JP); Hiroyuki Suzuki, Kanagawa (JP)

(73) Assignee: Panasonic Corporation, Osaka (JP)

( * ) Notice: Subject to any disclaimer, the term of this patent is extended or adjusted under 35 U.S.C. 154(b) by 394 days.

(21) Appl. No.: 12/161,668

(22) PCT Filed: Feb. 3, 2006

(86) PCT No.: PCT/JP2006/301851
§ 371 (c)(1),
(2), (4) Date: Jul. 21, 2008

(87) PCT Pub. No.: WO2007/088631
PCT Pub. Date: Aug. 9, 2007

(65) Prior Publication Data
US 2010/0220457 A1    Sep. 2, 2010

(51) Int. Cl.
*H05K 1/11* (2006.01)
(52) U.S. Cl. ........................ 174/261; 361/803
(58) Field of Classification Search ............ 175/254, 175/260, 262, 261; 361/749, 681, 760, 803
See application file for complete search history.

(56) References Cited

U.S. PATENT DOCUMENTS

| | | | | |
|---|---|---|---|---|
| 5,317,438 A | * | 5/1994 | Suzuki et al. | 349/192 |
| 5,841,194 A | * | 11/1998 | Tsukamoto | 257/729 |
| 7,102,228 B2 | * | 9/2006 | Kanda | 257/730 |
| 7,372,130 B2 | * | 5/2008 | Kikuchi et al. | 257/668 |
| 7,551,452 B2 | * | 6/2009 | Ishimaru et al. | 361/760 |

FOREIGN PATENT DOCUMENTS

| | | |
|---|---|---|
| JP | 58-102473 | 6/1983 |
| JP | 03-228088 | 10/1991 |
| JP | 05-205841 | 8/1993 |
| JP | 07-318960 | 12/1995 |
| JP | 09-281520 | 10/1997 |
| JP | 10-096944 | 4/1998 |

OTHER PUBLICATIONS

International Search Report for PCT/JP2006/301851; Feb. 27, 2006.

* cited by examiner

*Primary Examiner* — Yuriy Semenenko
(74) *Attorney, Agent, or Firm* — Seed IP Law Group PLLC

(57) ABSTRACT

In a circuit board-connecting portion 10, a first connecting portion 15 and a second connecting portion 20 are disposed in facing relation such that first conductors 14 contact second conductors 19, and also a first substrate 12 and a second substrate 17 are fixed to each other by an adhesive 22. The first connecting portion 15 has rigid members 24 provided at a reverse surface 12B of the first substrate 12 which is a soft substrate, and the rigid members 24 are disposed along a direction of a thickness of the first substrate 14, and are provided at positions corresponding to at least parts 14A of the first conductors 14.

4 Claims, 9 Drawing Sheets

CONNECTING PORTION OF CIRCUIT BOARD AND CIRCUIT BOARD-CONNECTING STRUCTURE

TECHNICAL FIELD

FIELD OF THE INVENTION

The present invention relates to a connecting portion of a circuit board in which a circuit pattern is formed on a surface of a soft substrate, and the connecting portion is connected to the circuit pattern and has conductors disposed on the substrate, and also to a circuit board-connecting structure for connecting portions of a pair of circuit boards.

BACKGROUND ART

Generally, a circuit board comprises a circuit pattern formed along a substrate, and a connecting portion which is connected to the circuit pattern and has straight conductors extending toward an edge portion of the substrate, and the circuit board is electrically connected to other circuit board or the like through this connecting portion.

Conventionally, for electrically connecting the circuit board to other circuit board, there have been adopted a structure of fixing a connection part such as a connector to the connecting portion or a structure in which a connecting portion of the other circuit board is stacked on the connecting portion in facing relation, and the connecting portions are connected together by soldering or the like.

In recent years, in order to omit the connection part and a soldering process, there has been proposed a connecting structure in which connection portions of circuit boards are disposed in facing relation, and the connection is fixed by an adhesive.

In such a connecting structure, in order to obtain a conductive connection between the connecting portions, the circuit boards have been pressed against each other along a direction of stacking of the circuit boards, thereby forcing the adhesive, residing between the connecting portions, out from between conductors.

Incidentally, in order to obtain a good conductive connection between the connecting portions, it is necessary to positively force the adhesive out from between the conductors of the connecting portions so that the conductors can positively contact each other.

In order to satisfy such a requirement, for example, an electrical connection method and a liquid crystal display device (Patent Literature 1) in which plating bumps or the like of a convex shape are provided on conductors of a connecting portion to form partial contact points, and the forcing-out of an adhesive is effected satisfactorily, thereby obtaining a conductive connection between the conductors, or a flexible wiring sheet joining method (Patent Literature 2) in which a rigid support member having continuous projections is located, and insulating covering layers of a thermoplastic resin are fused by heat, and upper and lower sheets are mechanically connected together, and also wirings are electrically connected together, thereby effecting the joining, or others have been proposed.

Patent Literature 1: JP-A-10-96944 Publication
Patent literature 2: JP-A-5-205841 Publication

DISCLOSURE OF THE INVENTION

Problem that the Invention is to Solve

However, in Patent Literature 1, in order to obtain the conductive connection between the conductors, the plating bumps or the like of a convex shape need to be provided on the conductors of the connecting portion, and there is a problem that the connecting process is increased.

On the other hand, in Patent Literature 2, the rigid support member having the continuous projections is located, and therefore the deterioration of the board due to the projections and the deterioration of a body of the rigid support member occur. And besides, it is necessary to change the rigid support member in accordance with the size of the joining portion. Therefore, there are problems from the viewpoints of the cost and quality.

The present invention has been made in order to solve the above-mentioned problems, and its object is to provide a connecting portion of a circuit board and a circuit board-connecting structure, in which connecting portions can be positively connected together, and also a connecting process can be simplified.

Means for Solving the Problem

A connecting portion of a circuit board according to the present invention is characterized in that the connection portion is connected to a circuit pattern formed along a surface of a soft substrate formed into a sheet-like shape, and has a conductor disposed on the substrate; and a rigid member is provided at a reverse surface of the soft substrate; and the rigid member is disposed along a direction of a thickness of the soft substrate, and is provided at a position corresponding to at least part of the conductor.

The rigid member is provided at the reverse surface of the soft substrate, and is disposed along the direction of the thickness of the soft substrate, and this rigid member is caused to correspond to at least part of the conductor.

Therefore, by pressing the rigid member, that portion of the conductor corresponding to the rigid member can be projected from the other portion, thereby providing a projected portion of the conductor at the connecting portion.

Therefore, the projected portion of the conductor, the conductor of the soft substrate, can be positively electrically connected to a conductor of other soft substrate or a conductor of a rigid substrate.

In addition, the rigid member is pressed to thereby form the projected portion of the conductor, and by electrically connecting this projected portion to the conductor of the other connecting portion, the process of connecting the connecting portion can be simplified.

Here, the rigid member means a member which is not limited in shape, etc., and is more rigid than the soft substrate.

Further, the connection portion of the circuit board according to the present invention is characterized in that the rigid member is disposed in intersecting relation to the conductor.

Therefore, by pressing the rigid member, the portion of the conductor corresponding to the rigid member can be suitably projected from the other portion, thereby satisfactorily providing the projected portion of the conductor at the connecting portion.

Therefore, the projected portion of the conductor can be more satisfactorily electrically connected to the conductor of the other connecting portion.

Furthermore, a circuit board-connecting structure of the present invention is characterized in that the structure comprises a first circuit board and a second circuit board each including a circuit pattern, formed along a surface of a substrate formed into a sheet-like shape, and a connecting portion which is connected to the circuit pattern and has a conductor disposed on the substrate; and the connecting portions are disposed in facing relation such that the conductors contact each other, and the substrates are fixed to each other by an adhesive; and the substrate of the first circuit board is a soft substrate, and a rigid member is provided at a reverse surface of the substrate; and the rigid member is disposed along a direction of a thickness of the soft substrate, and is provided at a position corresponding to at least part of the conductor.

The rigid member is provided at the reverse surface of the soft substrate, and is disposed along the direction of the thickness of the soft substrate, and this rigid member is caused to correspond to at least part of the conductor.

Therefore, by pressing the rigid member, that portion of the conductor corresponding to the rigid member can be projected from the other portion, thereby providing a projected portion of the conductor at the connecting portion.

Therefore, an adhesive is forced out by the projected portion of the conductor, and by electrically connecting the projected portion of the conductor to a conductor of other connecting portion, the projected portion of the conductor can be positively connected to the conductor of the other connecting portion.

In addition, the rigid member is pressed to thereby form the projected portion of the conductor, and by electrically connecting this projected portion to the conductor of the other connecting portion, the process of connecting the connecting portion can be simplified.

Further, the circuit board-connecting structure of the present invention is characterized in that the rigid member is disposed in intersecting relation to the conductor.

Therefore, by pressing the rigid member, the portion of the conductor corresponding to the rigid member can be suitably projected from the other portion, thereby satisfactorily providing the projected portion of the conductor at the connecting portion.

Therefore, the projected portion of the conductor can be more satisfactorily electrically connected to the conductor of the other connecting portion.

Advantage of the Invention

In the present invention, the portion of the conductor corresponding to the rigid member is projected from the other portion, thereby providing the projected portion of the conductor at the connecting portion, and by doing so, there are provided advantages that the connecting portion can be positively connected and that the process of connecting the connecting portion can be simplified.

BRIEF DESCRIPTION OF THE DRAWINGS

FIG. 7(B) is a cross-sectional view showing the circuit board-connecting structure of the third embodiment.

FIG. 8(B) is a cross-sectional view showing the circuit board-connecting structure of the fourth embodiment.

FIG. 9(B) is a cross-sectional view showing the circuit board-connecting structure of the fifth embodiment.

Figure 1:
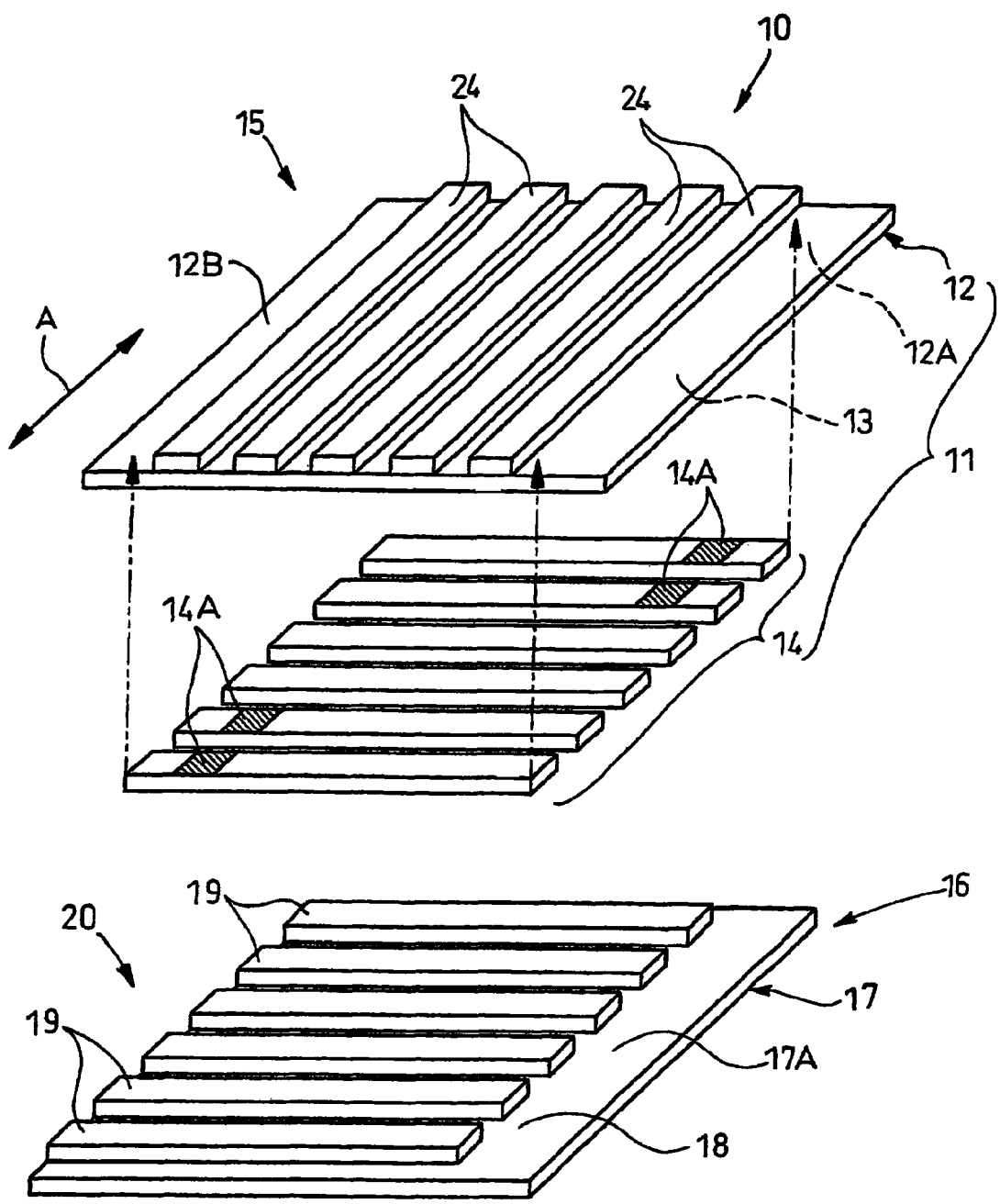
FIG. 1 is an exploded perspective view showing a first embodiment of a circuit board-connecting structure of the present invention.

DESCRIPTION OF THE REFERENCE NUMERALS 10 circuit board-connecting structure
11 first circuit board (circuit board)
12 first substrate (substrate)
12A surface of the first substrate
12B reverse surface of the first substrate
13 first circuit pattern (circuit pattern)
14 first conductor (conductor)
14A at least part of the first conductor
15, 30, 40, 50, 60 first connecting portion (connecting portion of the circuit board)
16 second circuit board (circuit board)
17 second substrate (substrate)
18 second circuit pattern (circuit pattern)
19 second conductor (conductor)
20 second connecting portion
22 adhesive
24, 31, 41, 51, 61 rigid member

BEST MODE FOR CARRYING OUT THE INVENTION

First Embodiment

Figure 2:
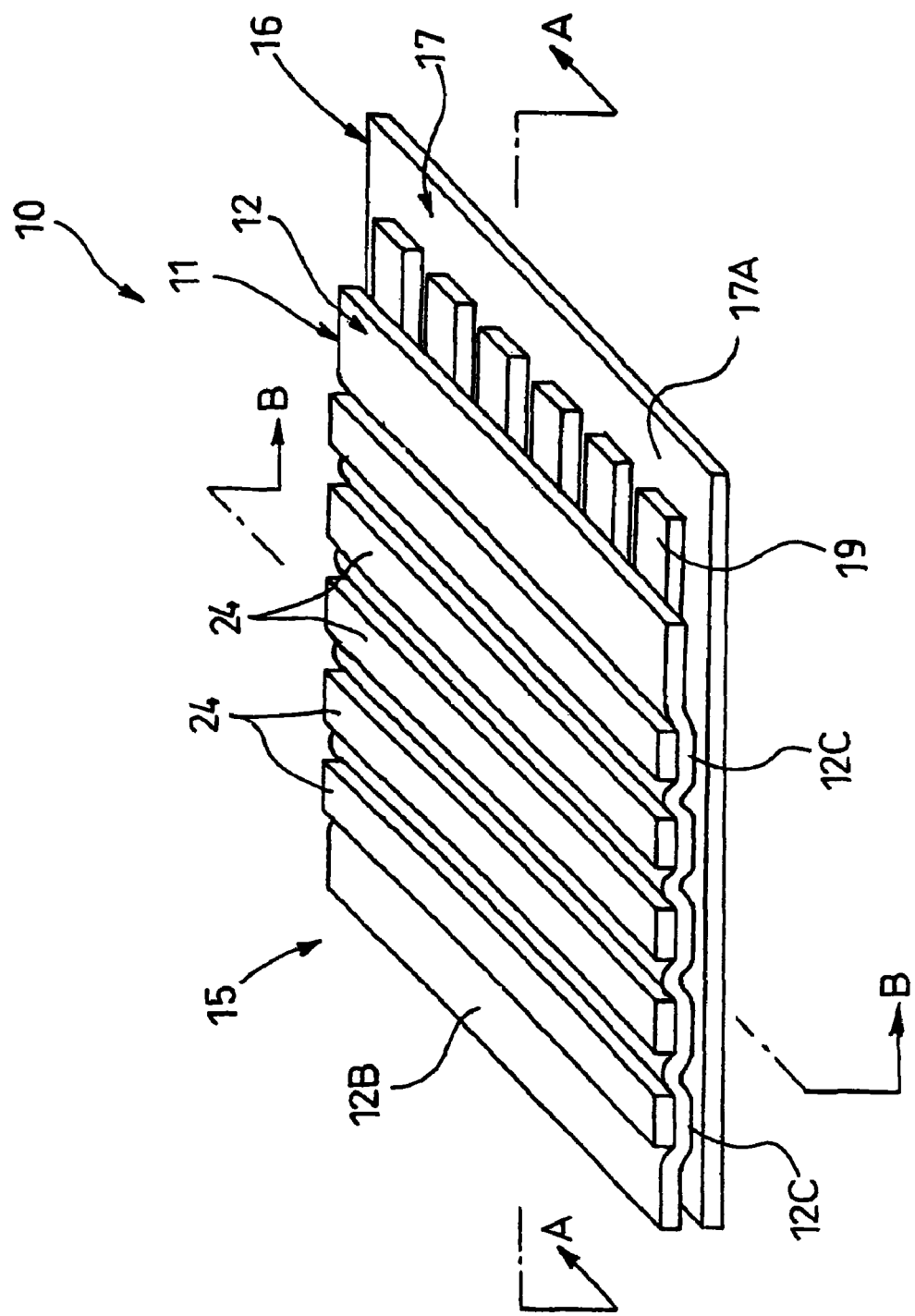
FIG. 2 is a perspective view showing the circuit board-connecting structure of the first embodiment.

As shown in FIG. 1 and FIG. 2, a circuit board-connecting structure 10 of a first embodiment comprises a first circuit board 11 including a first circuit pattern (circuit pattern) 13, formed along a surface 12A of a first substrate (substrate) 12 formed into a sheet-like shape, and a first connecting portion (connecting portion of the circuit board) 15 connected to the first circuit pattern 13 and having a plurality of (6) first conductors (conductors) 14 disposed on the first substrate 12, and further comprises a second circuit board 16 including a second circuit pattern (circuit pattern) 18, formed along a surface 17A of a second substrate 17 formed into a sheet-like shape, and a second connecting portion 20 connected to the second circuit pattern 18 and having a plurality of (6) second conductors (conductors) 19 disposed on the second substrate 17.

Figure 3:
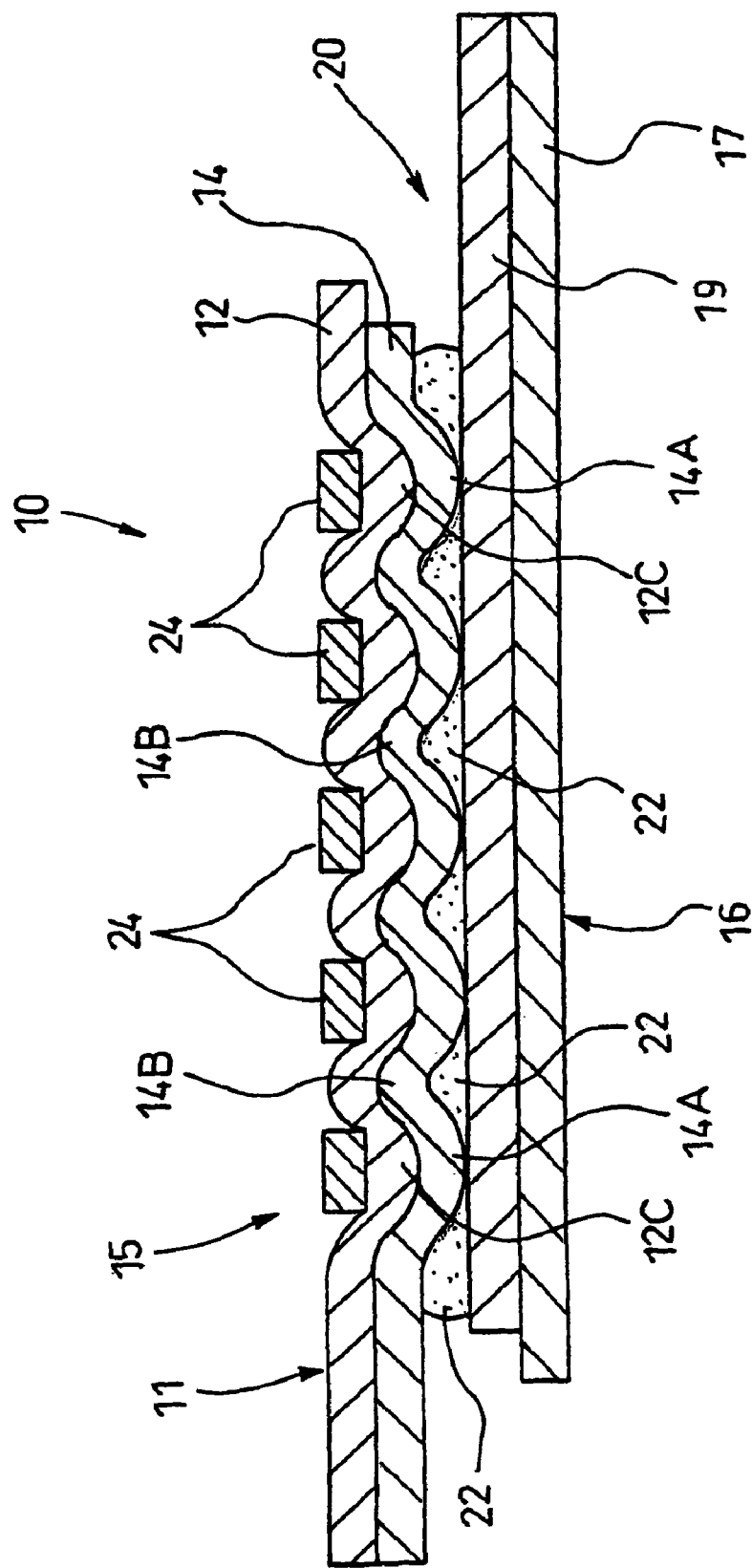
FIG. 3 is a cross-sectional view taken along the line A-A of FIG. 2.
Figure 4:
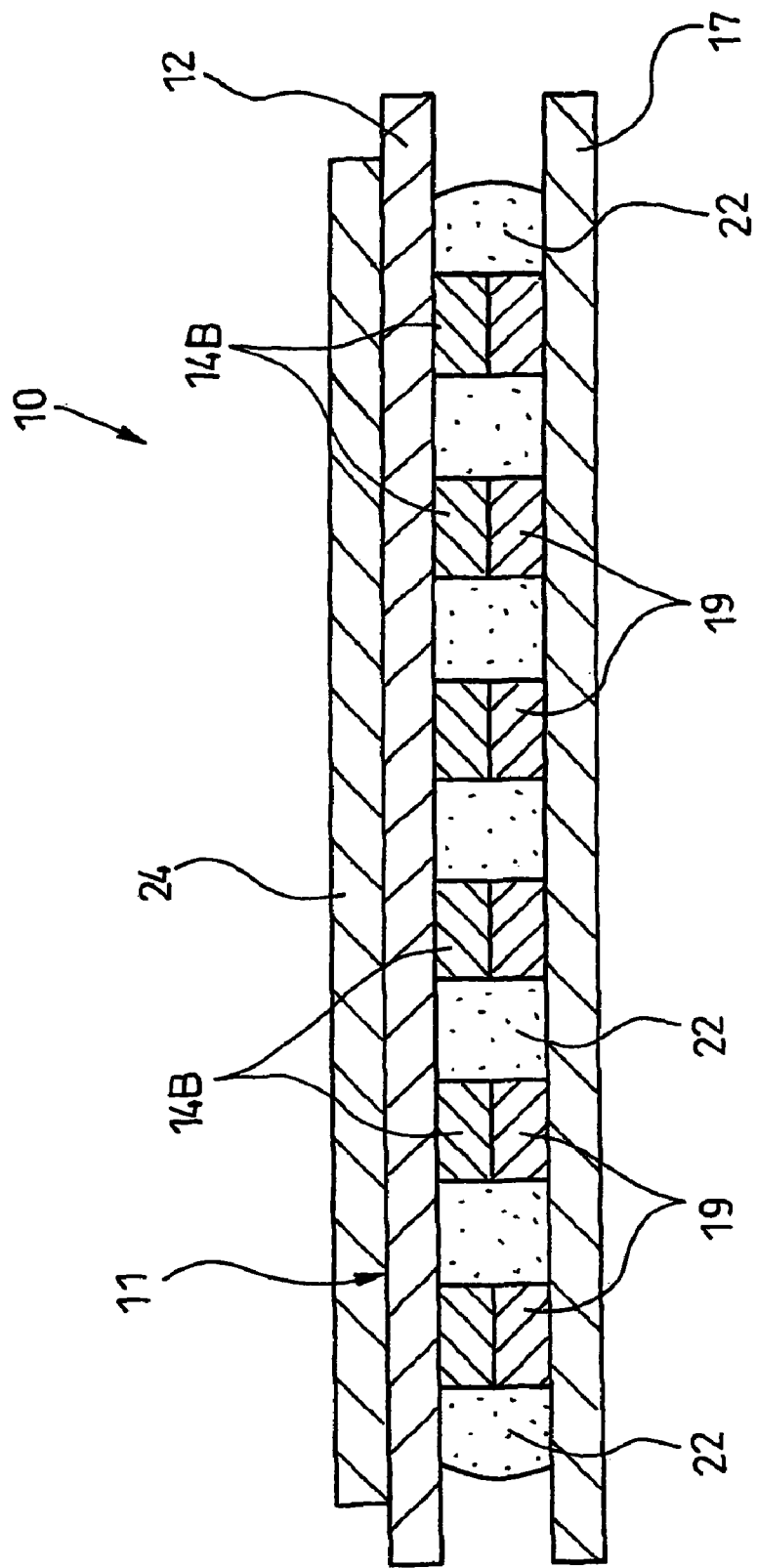
FIG. 4 is a cross-sectional view taken along the line B-B of FIG. 2.

In the circuit board-connecting structure 10, the first connecting portion 15 and the second connecting portion 20 are disposed in facing relation such that the first conductors 14 contact the second conductors 19, and also the first substrate 12 and the second substrate 17 are fixed to each other by an adhesive 22 (see FIG. 3 and FIG. 4).

The first circuit board 11 is such that the first substrate 12 is a soft substrate made of a soft material, and as one example, a flexible board or the like is used.

The second circuit board 16 is not limited to a flexible board or the like in which the second substrate 17 made of a soft material, and for example there can be used a rigid board in which the second substrate 17 is made of a rigid material.

The first connecting portion 15 has a plurality of (5) rigid members 24 provided at a reverse surface 12B of the first substrate 12 which is the soft substrate, and the rigid members 24 are disposed along a direction of a thickness of the first substrate 14, and are provided at positions corresponding to at least parts 14A of first conductors 14.

The direction of the thickness of the first substrate 14 means a direction of arrow A shown in FIG. 1.

The rigid member 24 is a strip-like member which is made of a material more rigid than the first substrate 12, and is formed into a length generally equal to the thickness dimension of the first substrate 14, and is disposed in intersecting relation to the first conductors 14.

The rigid member 24 is formed into the length generally equal to the thickness dimension of the first substrate 14, and also the rigid members 24 are disposed in intersecting relation to the first conductors 14, and by doing so, one rigid member 24 can be disposed in intersecting relation to the plurality of (6) first conductors 14.

Therefore, a required number of the parts 14A of the first conductors 14 can be easily secured.

Furthermore, by arranging the rigid member 24 in intersecting relation to the first conductors 14, the part 14A of the first conductor 14 to which the rigid member 24 corresponds can be formed into a generally-rectangular simple shape.

By forming the part 14A into the simple shape, the first conductors 14 can be satisfactorily projected when a pressing force is applied to the first conductors 14 through the rigid members 24.

With respect to the adhesive 22 a paste-like adhesive is given as an example, but the adhesive is not limited to this type, and other adhesive such as a film-like adhesive can be used.

As shown in FIG. 3 and FIG. 4, in the circuit board-connecting structure 10, those portions 12c of the first substrate 12 corresponding to the rigid members 24 are projected toward the second connecting portion 20 by the rigid members 24.

Like the first substrate 12, the parts 14A of the first conductors 14 corresponding to the rigid members 24 are projected toward the second connecting portion 20 by the rigid members 24.

Therefore, the parts 14A of the first conductors 14 corresponding to the rigid members 24 abut against the second conductors 19 of the second connecting portion 20, and therefore are electrically connected to the second conductors 19.

In the circuit board-connecting structure 10, the adhesive 22 exists between the first substrate 12 and the second substrate 17, and the first substrate 12 and the second substrate 17 are fixed to each other by this adhesive 22.

In addition, the parts 14A of the first conductors 14 corresponding to the rigid members 24 are projected, and only the parts 14 abut, so that a clearance is formed between each of other portions 14B of the first conductor 14 and the second conductor 19, and the adhesive 22 remains in this clearance.

Therefore, the other portions 14B of the first conductor 14 and the second conductor 19 can be adhesively bonded together by the adhesive 22, and therefore the ability of bonding between the first bonding portion 15 and the second bonding portion 20 can be further enhanced.

Next, an example in which the first bonding portion 15 and the second bonding portion 20 of the circuit board-connecting structure 10 are bonded together will be described with reference to FIG. 5(A) to FIG. 5(C).

Figure 5:
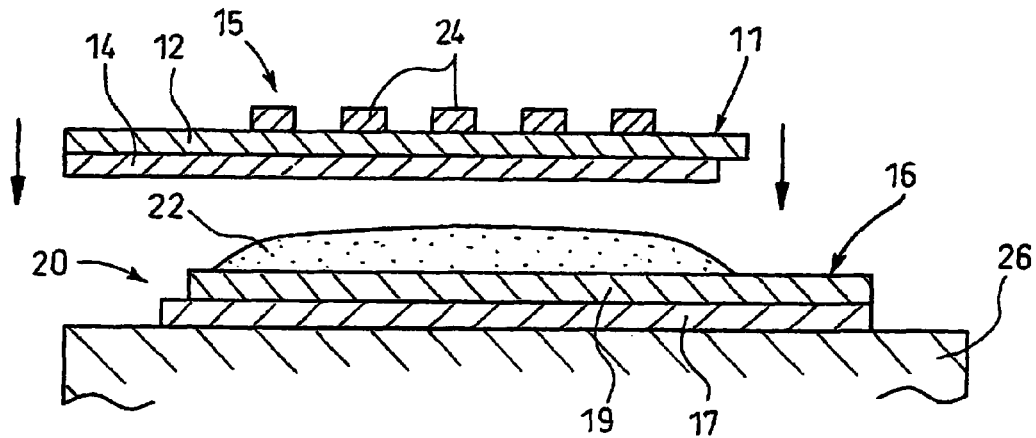
FIGS. 5 (A, B, C) are views explanatory of an example in which the circuit.
Figure 5:
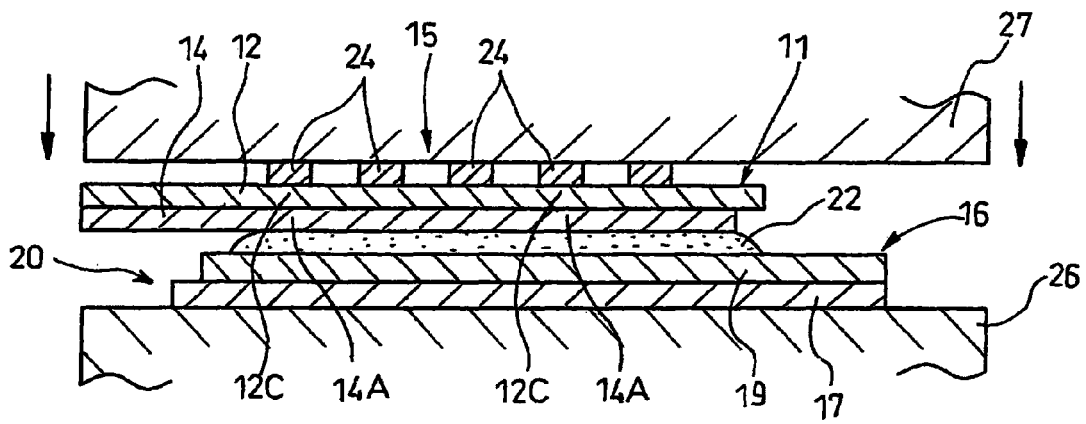
Figure 5:
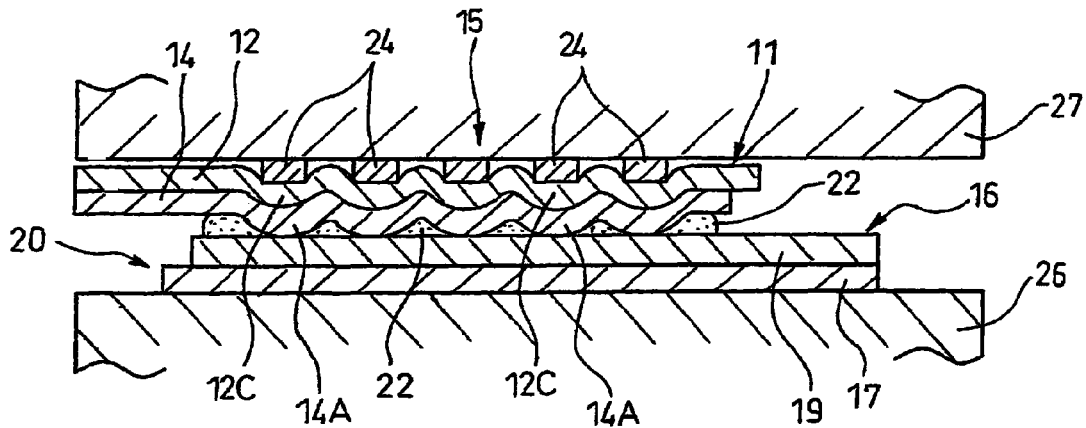
Figure 6:
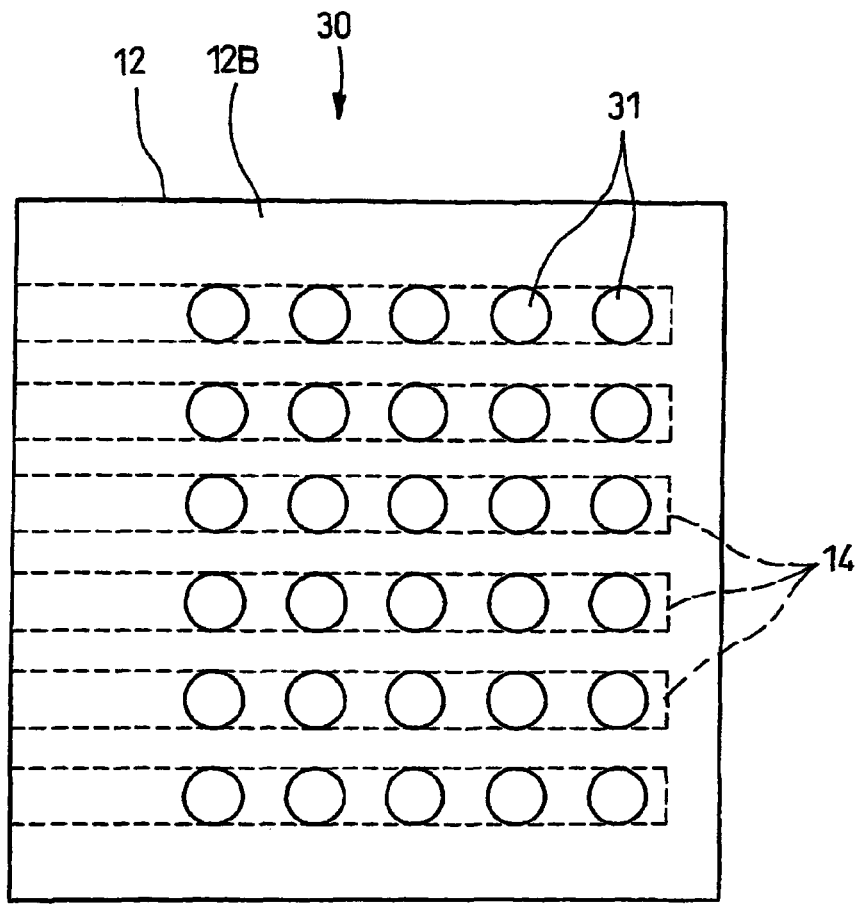
FIG. 6 (A) is a plan view showing a circuit board-connecting structure of a second embodiment, and FIG. 6 (B) is a cross-sectional view showing the circuit board-connecting structure of the second embodiment.
Figure 6:
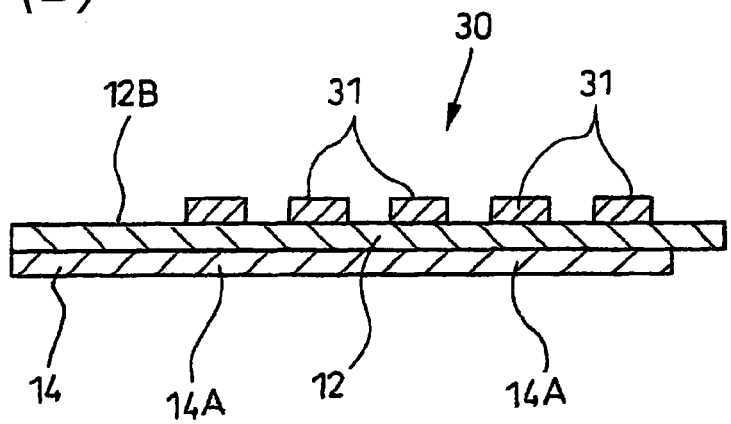
Figure 7:
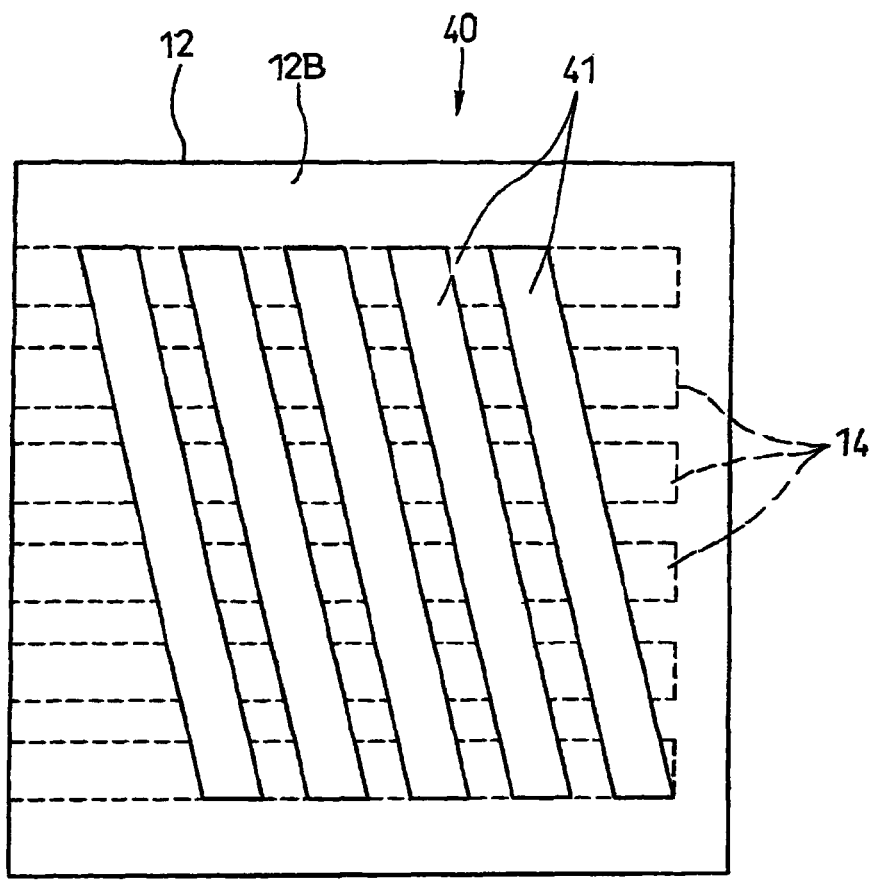
FIG. 7 (A) is a plan view showing a circuit board-connecting structure of a third embodiment.
Figure 7:
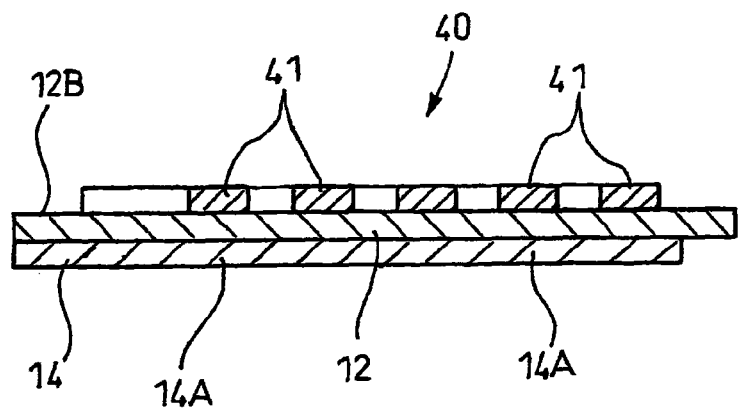
Figure 8:
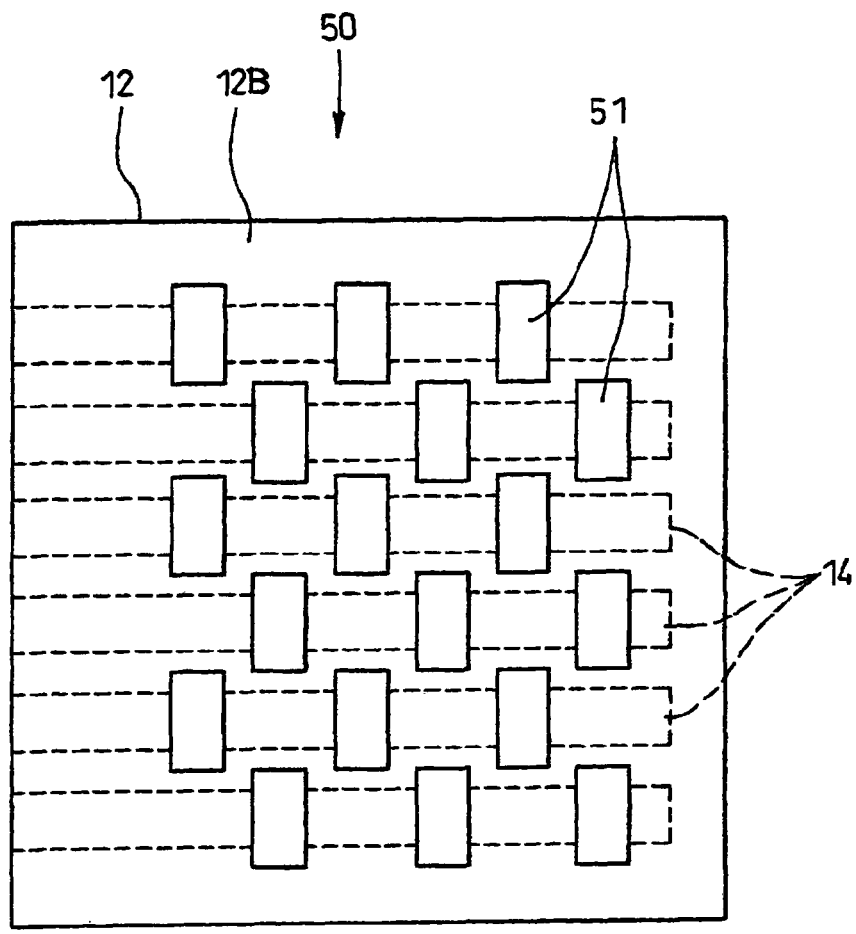
FIG. 8 (A) is a plan view showing a circuit board-connecting structure of a fourth embodiment.
Figure 8:
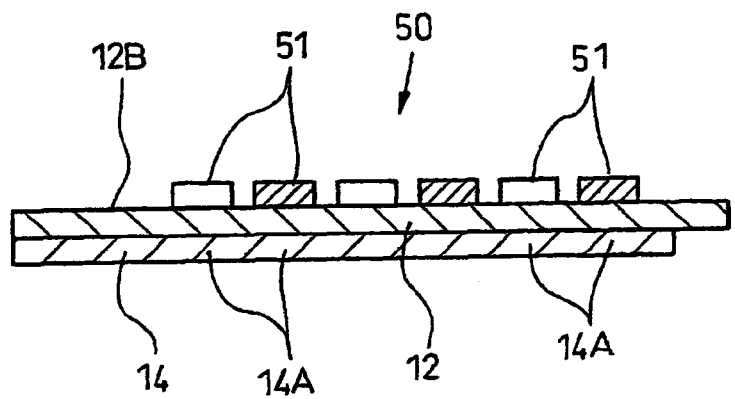
Figure 9:
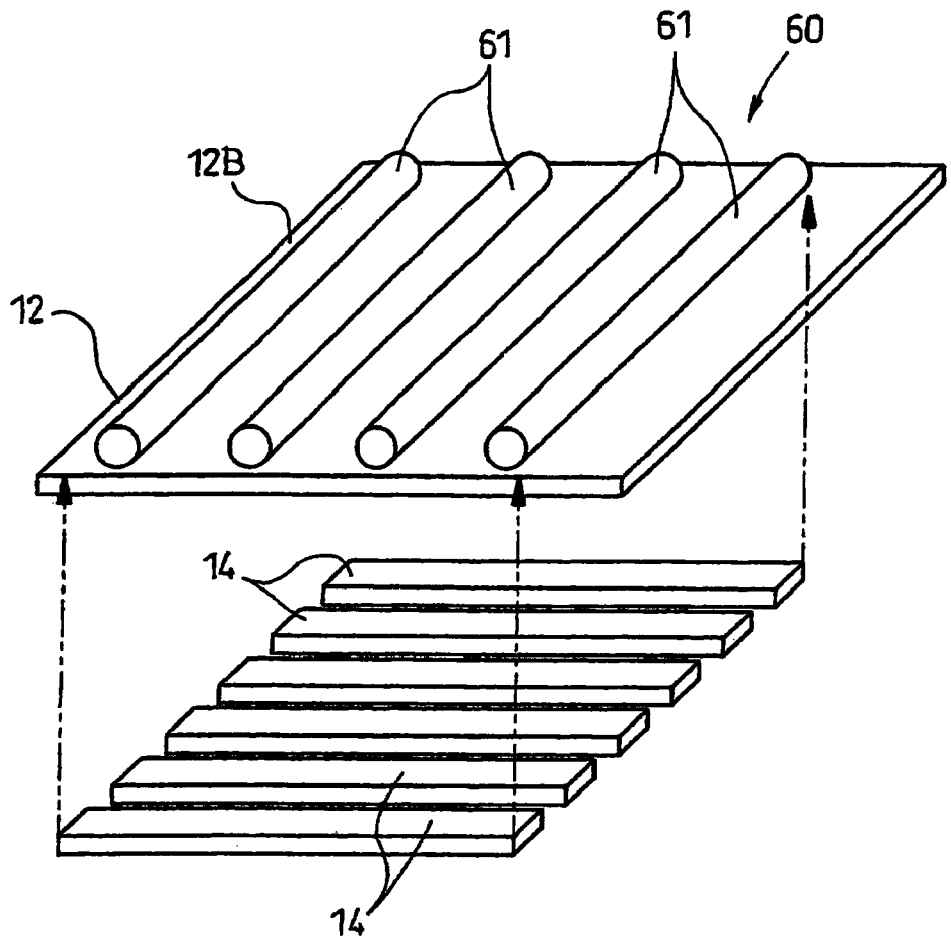
FIG. 9 (A) is a perspective view showing a circuit board-connecting structure of a fifth embodiment.
Figure 9:
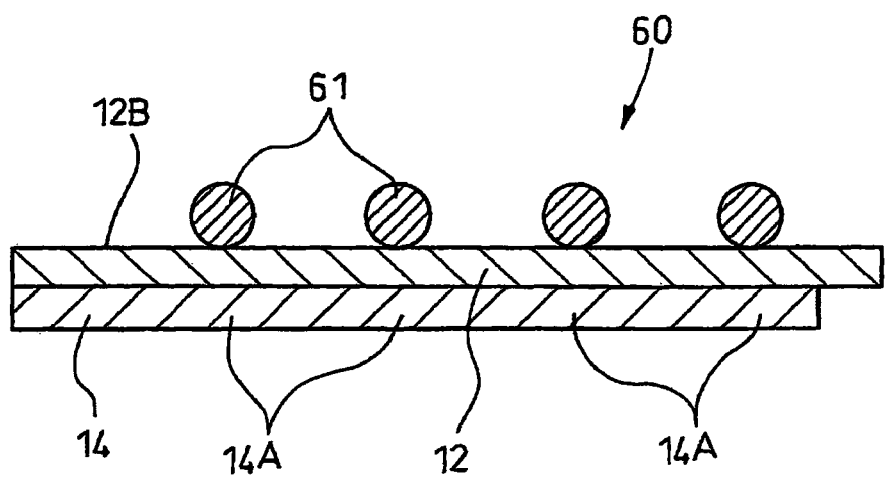

As shown in FIG. 5(A), after the second circuit board 16 is set on a fixed die 26, the adhesive 22 is coated onto the second bonding portion 20.

The first circuit board 11 is placed on the second circuit board 16 having the adhesive 22 coated thereon, so that the first connecting portion 15 and the second connecting portion are disposed in facing relation to each other.

As shown in FIG. 5(B), the rigid members 24 of the first circuit board 11 are pressed in a direction of arrows by a movable die 27. By the rigid members 24, the portions 12C of the first substrate 12 corresponding to the rigid members 24 are pressed, and also the parts 14A of the first conductors 14 corresponding to the rigid members 24 are pressed.

Incidentally, when the rigid members 24 of the first circuit board 11 are to be pressed in the direction of the arrows by the movable die 27, the first connecting portion 15 and the second connecting portion 20 are heated.

As shown in FIG. 5(C), the portions 12C of the first substrate 12 corresponding to the rigid members 24 are projected toward the second connecting portion 20 by the rigid members 24.

Also, like the first substrate 12, the parts 14A of the first conductors 14 corresponding to the rigid members 24 are projected toward the second connecting portion 20 by the rigid members 24.

Therefore, the adhesive 22 is forced out by the projected parts 14A, and the parts 14A abut against the second conductors 19 of the second connecting portion 20, and are electrically connected to the second conductors 19.

Thus, the adhesive 22 can be forced out by the projected parts 14A, and the parts 14 can be electrically connected to the second conductors 19 of the second connecting portion 20.

As described above, in the circuit board-connecting structure 10 of the first embodiment, by pressing the first circuit board 11 by the movable die 27 in the same manner as in a conventional production process, the first conductors 14 can be positively connected to the second conductors 19.

Therefore, there is no need to add a new step for the purpose of positively connecting the first conductors 14 to the second conductors 19, and therefore the connecting process can be simplified.

In addition, the rigid members 24 can be adapted for production facilities for the circuit board-connecting structure 10.

Therefore, there is no need to prepare new facilities for the purpose of positively connecting the first conductors 14 to the second conductors 19.

Next, second to fifth embodiments of the present invention will be described with reference to FIG. 6 to FIG. 9.

In the second to fifth embodiments, identical and similar members to those of the first embodiment will be designated by identical reference numerals, and description thereof will be omitted.

Second Embodiment

As shown in FIG. 6(A) and FIG. 6(B), in a first connecting portion (connection portion of a circuit board) 30 of a second embodiment, rigid members 31 are provided instead of the rigid members 24 of the first embodiment, and the other construction is similar to that of the first embodiment.

The rigid member 31 is a cylindrical block made of a material more rigid than a first substrate 12. A plurality of rigid members 31 are disposed on a reverse surface 12B of the first substrate 12, and are provided at positions corresponding to at least parts 14A of first conductors 14.

Therefore, the plurality of rigid members 31 are provided at desired positions, and by applying a pressing force to the parts 14A of the first conductors 14 by these rigid members 31, the first conductors 14 can be projected in a similar manner to the first embodiment.

Therefore, in the first connecting portion 30 of the second embodiment, advantages similar to those of the first connecting portion 15 of the first embodiment can be obtained.

In addition, in the first connecting portion 30 of the second embodiment, only the specified portions of the first conductors 14 can be projected by the use of the cylindrical rigid members 31, and therefore the first substrate 12 will not be projected between any two adjacent first conductors 14.

Therefore, a flow of an adhesive in a direction parallel to the first conductors 14 is good, and the ability of joining between the first conductors 14 and second conductors (not shown) can be further enhanced.

Incidentally, the shape of the rigid member 31 is not limited to a cylindrical shape, and may be, for example, a quadrangular prism-shape.

Third Embodiment

As shown in FIGS. 7(A) and 7(B), in a first connecting portion (connection portion of a circuit board) 40 of a third embodiment, rigid members 41 are provided instead of the rigid members 24 of the first embodiment, and the other construction is similar to that of the first embodiment.

The rigid members 41 are made of a material more rigid than a first substrate 12, and are provided at positions corresponding to at least parts 14A of first conductors 14 in such a condition that these rigid members are slightly inclined along a direction of a thickness of the first substrate 14.

Therefore, by applying a pressing force to the parts 14A of the first conductors 14 by the rigid members 41, the first conductors 14 can be projected in a similar manner to the first embodiment.

Therefore, in the first connecting portion 40 of the third embodiment, advantages similar to those of the first connecting portion 15 of the first embodiment can be obtained.

In addition, in the first connecting portion 40 of the third embodiment, with the use of the inclined rigid members 41, areas of projections at the first conductors 14 can be made larger as compared with the first embodiment in which the strip-like rigid members perpendicularly intersect the first conductors 14, and therefore the ability of joining to the second conductors can be further enhanced.

Fourth Embodiment

As shown in FIGS. 8(A) and 8(B), in a first connecting portion (connection portion of a circuit board) 50 of a fourth embodiment, rigid members 51 are provided instead of the rigid members 24 of the first embodiment, and the other construction is similar to that of the first embodiment.

The rigid member 51 is a rectangular block made of a material more rigid than a first substrate 12. A plurality of rigid members 51 are disposed on a reverse surface 12B of the first substrate 12, and are provided at positions corresponding to at least parts 14A of first conductors 14.

Therefore, the plurality of rigid members 51 are provided at desired positions, and by applying a pressing force to the parts 14A of the first conductors 14 by these rigid members 51, the first conductors 14 can be projected in a similar manner to the first embodiment.

Therefore, in the first connecting portion 50 of the fourth embodiment, advantages similar to those of the first connecting portion 15 of the first embodiment can be obtained.

In addition, in the first connecting portion 50 of the second embodiment, with the use of the rectangular rigid members 51, the first substrate 12 will not be projected between any two adjacent first conductors 14 in a similar manner to the second embodiment.

Therefore, a flow of an adhesive in a direction parallel to the first conductors 14 is good, and the ability of joining between the first conductors 14 and second conductors (not shown) can be further enhanced.

Furthermore, in the second embodiment, the rigid members need to be disposed just above the first conductors 14, and therefore a production technique of a high precision is required.

On the other hand, in the above-mentioned fourth embodiment, by arranging the rigid members 51 in a discrete manner, a margin for variations in positional accuracy, etc., can be secured. Further, in the fourth embodiment, by arranging the rigid members 51 in a staggered manner, the number of contact points can be increased, and the ability of joining to the second conductors can be further enhanced.

Incidentally, the shape of the rigid member 51 is not limited to a rectangular shape, and may be, for example, an oval shape or a rectangular shape.

Fifth Embodiment

As shown in FIGS. 9(A) and 9(B), in a first connecting portion (connection portion of a circuit board) 60 of a fifth embodiment, rigid members 61 are provided instead of the rigid members 24 of the first embodiment, and the other construction is similar to that of the first embodiment.

The rigid member 61 is formed into a round cross-sectional shape, and except this, it is similar to the rigid member 24. By forming the rigid member 61 into the cross-sectionally round shape, a lower portion 61 of the rigid member 61 linearly contacts a reverse surface 12B of a first substrate 12.

The lower portions 61A of the rigid members 61 are provided at positions corresponding to parts 14A of first conductors 14.

Therefore, by applying a pressing force to the parts 14A of the first conductors 14 by the lower portions 61A of the rigid members 61, the parts 14A can be pressed in a more localized manner, and therefore the first conductors 14 can be projected more satisfactorily.

Therefore, in the first connecting portion 60 of the fifth embodiment, by more satisfactorily projecting the parts 14A of the first conductor 14, an adhesive 22 can be forced out more suitably by the parts 14A, and the first conductors 14 can be more positively connected to second conductors 19.

Incidentally, in the second embodiment, the bottom surface of the rigid member 31 is formed into a flat shape, but is not limited to this, and the bottom surface of the rigid member 31 may be formed into a generally spherical shape, and by providing the spherical bottom surfaces at positions corresponding to the parts 14A of the first conductors 14, similar advantages to those of the fifth embodiment can be obtained.

Furthermore, in the third embodiment, the bottom surface of the rigid member 41 is formed into a flat shape, but is not limited to this, and the bottom surface of the rigid member 41 may be formed into a curved shape, and by providing the curved bottom surfaces at positions corresponding to the parts 14A of the first conductors 14, similar advantages to those of the fifth embodiment can be obtained.

Furthermore, in the fourth embodiment, the bottom surface of the rigid member 51 is formed into a flat shape, but is not limited to this, and the bottom surface of the rigid member 51 may be formed into a curved shape, and by providing the curved bottom surfaces at positions corresponding to the parts 14A of the first conductors 14, similar advantages to those of the fifth embodiment can be obtained.

INDUSTRIAL APPLICABILITY

The present invention is suitably applied to the connecting portion of the circuit board in which the circuit pattern is formed on the surface of the soft substrate, and the connecting portion is connected to the circuit pattern and has the conductors disposed on the substrate, and also to the circuit board-connecting structure for connecting the connecting portions of the pair of circuit boards.

The invention claimed is:

1. A connecting portion of a circuit board that is connected to a circuit pattern formed along a surface of a soft substrate formed into a sheet-like shape, and has a conductor disposed on the substrate, comprising:
   a rigid member, provided at a reverse surface of the soft substrate;
   wherein the rigid member is disposed along a direction of a thickness of the soft substrate at a position corresponding to at least part of the conductor, the rigid member configured to deform the soft substrate when a force is applied to the rigid member in a direction extending from the reverse surface to the surface.

2. The connecting portion of the circuit board recited in claim 1, wherein the rigid member is disposed in intersecting relation to the conductor.

3. A circuit board-connecting structure,
   in which the structure comprises a first circuit board and a second circuit board each including a circuit pattern formed along a surface of a substrate formed into a sheet-like shape, and a connecting portion connected to the circuit pattern and having a conductor disposed on the substrate, and
   in which the connecting portions are disposed in facing relation such that the conductors contact each other, and the substrates are fixed to each other by an adhesive;
   wherein the substrate of the first circuit board is a soft substrate and has a rigid member provided at a reverse surface of the substrate; and
   the rigid member is disposed along a direction of a thickness of the soft substrate at a position corresponding to at least part of the conductor, the rigid member configured to deform the substrate when a force is applied to the rigid member in a direction extending from the reverse surface to the surface.

4. The circuit board-connecting structure recited in claim 3, wherein the rigid member is disposed in intersecting relation to the conductor.

* * * * *